United States Patent
Wang et al.

(10) Patent No.: US 10,496,867 B2
(45) Date of Patent: Dec. 3, 2019

(54) DISPLAY DEVICE AND FINGERPRINT IDENTIFICATION METHOD

(71) Applicant: BOE TECHNOLOGY GROUP CO., LTD., Beijing (CN)

(72) Inventors: Pengpeng Wang, Beijing (CN); Xue Dong, Beijing (CN); Jing Lv, Beijing (CN); Haisheng Wang, Beijing (CN); Chunwei Wu, Beijing (CN); Xiaoliang Ding, Beijing (CN); Yingming Liu, Beijing (CN); Wei Liu, Beijing (CN); Yanling Han, Beijing (CN); Xueyou Cao, Beijing (CN); Changfeng Li, Beijing (CN); Rui Xu, Beijing (CN); Yanan Jia, Beijing (CN); Lijun Zhao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 144 days.

(21) Appl. No.: 15/553,127

(22) PCT Filed: Feb. 24, 2017

(86) PCT No.: PCT/CN2017/074726
§ 371 (c)(1),
(2) Date: Aug. 23, 2017

(87) PCT Pub. No.: WO2017/206558
PCT Pub. Date: Dec. 7, 2017

(65) Prior Publication Data
US 2018/0173926 A1    Jun. 21, 2018

(30) Foreign Application Priority Data

May 31, 2016  (CN) .......................... 2016 1 0378410

(51) Int. Cl.
*G06K 9/00* (2006.01)
*G02F 1/01* (2006.01)
(Continued)

(52) U.S. Cl.
CPC ......... *G06K 9/0004* (2013.01); *G02F 1/0105* (2013.01); *G02F 1/1336* (2013.01); *G06K 9/00033* (2013.01); *G06K 9/6202* (2013.01)

(58) Field of Classification Search
CPC ............. G06K 9/0004; G06K 9/00033; G06K 9/6202; G02F 1/1336; G02F 1/0105
See application file for complete search history.

(56) References Cited

U.S. PATENT DOCUMENTS 5,991,467 A * 11/1999 Kamiko ............... G06K 9/0004
                                                              250/208.1
2003/0025897 A1   2/2003 Iwai
(Continued)

FOREIGN PATENT DOCUMENTS

CN          1402183 A        3/2003
CN        101352345 A        1/2009
(Continued)

OTHER PUBLICATIONS

International Search Report received for PCT Patent Application No. PCT/CN2017/074726, dated May 24, 2017, 6 pages (2 pages of English Translation and 4 pages of Original Document).

*Primary Examiner* — John B Strege
(74) *Attorney, Agent, or Firm* — Womble Bond Dickinson (US) LLP (57) ABSTRACT

The present disclosure provides a display device and a fingerprint identification method thereof, which belong to the field of fingerprint identification technology and can solve the existing problems of complex reflective light path in the process of fingerprint identification, large noise in the
(Continued)

sensed signal and low accuracy of fingerprint identification. The display device in which the fingerprint identification method of a display device of the present disclosure is applicable comprises a plurality of pixel units for display, and a plurality of light sensing units for generating a sensed signal based on intensity of received light; the fingerprint identification method comprises: enabling part of the pixel units to emit light and keeping other pixel units not to emit light, and performing fingerprint identification based on the sensed signal generated by the plurality of light sensing units.

16 Claims, 4 Drawing Sheets

(51) Int. Cl.
*G02F 1/13357* (2006.01)
*G06K 9/62* (2006.01)

(56) References Cited

U.S. PATENT DOCUMENTS

| | | | |
|---|---|---|---|
| 2009/0028396 | A1 | 1/2009 | Kishima |
| 2009/0134328 | A1 | 5/2009 | Yamaguchi et al. |
| 2016/0092717 | A1 | 3/2016 | Ling |
| 2016/0283772 | A1* | 9/2016 | Nelson ............... G06F 3/0421 |
| 2017/0169275 | A1* | 6/2017 | Mackey ............ G06K 9/00013 |
| 2017/0279948 | A1* | 9/2017 | Hong ............... G06K 9/00013 |
| 2017/0289805 | A1* | 10/2017 | Hong ................ G09G 3/3233 |
| 2018/0096188 | A1* | 4/2018 | Xu .................... G06K 9/00013 |
| 2018/0129798 | A1* | 5/2018 | He .................... G06K 9/00013 |
| 2018/0196985 | A1* | 7/2018 | Ling .................. G06K 9/0004 |

FOREIGN PATENT DOCUMENTS

| | | |
|---|---|---|
| CN | 101447018 A | 6/2009 |
| CN | 104318205 A | 1/2015 |
| CN | 106022292 A | 10/2016 |
| CN | 205656407 U | 10/2016 |

* cited by examiner ( Prior Art )
Fig.1

DISPLAY DEVICE AND FINGERPRINT IDENTIFICATION METHOD

RELATED APPLICATION

The present application claims priority of the Chinese patent application numbered 201610378410.9 filed on May 31, 2016, all contents of which are incorporated herein by reference.

FIELD OF THE INVENTION

The present disclosure relates to the field of fingerprint identification technology, particularly to a display device and a fingerprint identification method thereof.

BACKGROUND OF THE INVENTION

Figure 1:
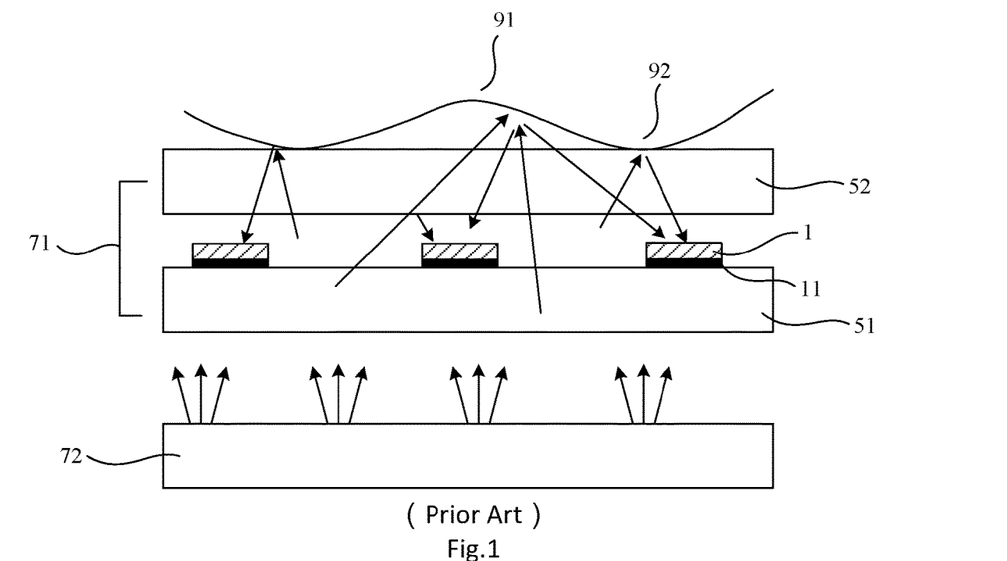
FIG. 1 is a schematic view of a sectional structure of an existing display device with the fingerprint identification function.

With the development of technology, many display devices such as mobile phones, panel computers begin to have fingerprint identification functions. In an existing display device as shown in FIG. 1, a backlight source 72 is arranged at a light entrance side of the liquid crystal display panel 71. The liquid crystal display panel 71 comprises a first substrate 51 (a substrate away from a light exit side) and a second substrate 52 (a substrate close to the light exit side) which are assembled. A plurality of light sensing units 1 are arranged in the first substrate 51, and a light shielding layer 11 is arranged at a side of the light sensing unit 1 close to the backlight source 72. When a finger presses the second substrate 52, the light that penetrates the liquid crystal display panel 71 can be reflected back to the light sensing units 1. The valley 91 and the ridge 92 of the fingerprint reflect light differently, so the sensed signals (such as photocurrent) generated by the light sensing units 1 at positions corresponding to the valley 91 and the ridge 92 are also different. By comparing the sensed signal of each light sensing unit 1, it can be determined whether it corresponds to the valley 91 or the ridge 92 of the fingerprint, thereby obtaining a pattern of the fingerprint, so as to realize fingerprint identification.

However, many structures in the display device can cause reflection, and various positions of the backlight source 72 can emit light simultaneously, thereby rendering the actually reflected light path in the display device rather complex. For example, the light emitted by the backlight source 72 might be directly reflected to the light sensing unit 1 by the second substrate 52 before it reaches the finger, the light emitted to the same position of the finger might come from a plurality of different positions, and would be reflected to a plurality of different light sensing units 1 correspondingly. That is to say, the sources of the light received by each light sensing unit 1 are very complex, and it is difficult to determine which part thereof is reflected by the fingerprint corresponding to it, therefore, the noise in the generated sensed signal is large, so as to be difficult to perform an accurate fingerprint identification.

SUMMARY OF THE INVENTION

Embodiments of the present disclosure provide a display device capable of avoiding other interference and a fingerprint identification method thereof.

A technical solution adopted for solving a technical problem of the present disclosure is a fingerprint identification method of a display device, the display device comprising a plurality of pixel units for display, and a plurality of light sensing units for generating sensed signals based on intensity of received light. The fingerprint identification method comprises: enabling part of the pixel units to emit light and keeping other pixel units not to emit light, and performing fingerprint identification based on the sensed signal generated by the plurality of light sensing units.

Optionally, said performing fingerprint identification based on the sensed signal generated by the plurality of light sensing units comprises: according to a corresponding relationship between the light sensing unit and the pixel unit, during a light emitting period of the pixel unit, only turning on a corresponding light sensing unit, and performing fingerprint identification based on the sensed signal generated by the plurality of light sensing units.

Optionally, the fingerprint identification method comprises n phases, wherein n is an integer greater than or equal to 2; said enabling part of the pixel units to emit light and keeping other pixel units not to emit light comprises: in each phase, enabling a group of pixel units to emit light and keeping other pixel units not to emit light, and pixel units that emit light in any two phases are not identical.

Further optionally, the pixel units are divided into n groups; said enabling part of the pixel units to emit light and keeping other pixel units not to emit light comprises: in each phase, enabling a group of pixel units to emit light and keeping all other pixel units not to emit light, and in the n phases, enabling each group of pixel units to emit light once.

Further optionally, for each of the pixel units, at least one of the pixel units adjacent to it is a pixel unit not in a same group as this pixel unit.

Further optionally, n=2, the plurality of pixel units are divided into a first group of pixel units and a second group of pixel units. The plurality of pixel units are arranged in an array. In any two adjacent rows of pixel units, one row of pixel units belong to the first group of pixel units, and the other row of pixel units belong to the second group of pixel units. Or, in any two adjacent columns of pixel units, one column of pixel units belong to the first group of pixel units, and the other column of pixel units belong to the second group of pixel units. Or, all of pixel units directly adjacent to each of the first group of pixel units in the row or column direction belong to the second group of pixel units; all of pixel units directly adjacent to each of the second group of pixel units in the row or column direction belong to the first group of pixel units.

Optionally, each pixel unit only corresponds to one light sensing unit at most.

Further optionally, each light sensing unit only corresponds to one pixel unit.

A technical solution adopted for solving a technical problem of the present disclosure is a display device, comprising: a plurality of pixel units for display, a plurality of light sensing units for generating a sensed signal based on intensity of received light, a control unit for enabling part of the pixel units to emit light and keeping other pixel units not to emit light when performing fingerprint identification, and an analysis unit for performing fingerprint identification based on the sensed signal generated by the plurality of light sensing units.

Optionally, the display device comprises a first substrate and a second substrate which are assembled, wherein the second substrate is located at a light exit side of the display device, the light sensing units are arranged in the second substrate, and a side thereof facing towards the first substrate is provided with a light shielding layer.

Optionally, the display device comprises a first substrate and a second substrate which are assembled, wherein the second substrate is located at a light exit side of the display device, the light sensing units are arranged in the first substrate, and the first substrate is an array substrate.

Optionally, each of the light sensing units corresponds to one pixel unit. A distance between the light sensing unit and the pixel unit to which it corresponds is smaller than a distance between the light sensing unit and any one of other pixel units.

Optionally, each pixel unit only corresponds to one light sensing unit at most.

Further optionally, each light sensing unit only corresponds to one pixel unit.

Optionally, the display device is a light emitting diode display device.

In the display device and the fingerprint identification method of the present disclosure, not all pixel units emit light together when performing fingerprint identification, but only part of the pixel units emit light, while other pixel unit do not emit light, so the light incident on each light sensing unit can only come from the pixel units that emit light currently. Therefore, the light path thereof is relatively simple, it is easy to determine the source of the light accurately, the noise in the sensed signal is small, and the accuracy of fingerprint identification is high.

REFERENCE SIGNS

1—light sensing unit; 11—light shielding layer; 51—first substrate; 52—second substrate; 6—pixel unit; 71—liquid crystal display panel; 72—backlight unit; 91—valley; 92—ridge.

DETAILED DESCRIPTION OF THE INVENTION

In order to enable the skilled person in the art to understand the technical solution of the present disclosure better, the present disclosure will be described in more details with reference to the drawings and the specific implementations below.

As shown in FIG. 2 to FIG. 7, this embodiment provides a display device. The display device comprises: a plurality of pixel units 6 for display; a plurality of light sensing units 1 for generating a sensed signal based on intensity of received light; a control unit 7 for enabling part of the pixel units 6 to emit light and keeping other pixel units 6 not to emit light when performing fingerprint identification; and an analysis unit 8 for performing fingerprint identification based on the sensed signal generated by the plurality of light sensing units 1.

That is to say, the display device of this embodiment comprises a plurality of pixel units 6 for display. The pixel unit 6 is a point that can display any required content separately, i.e., "pixel". Or, the pixel unit 6 can also be a point in each pixel that can display one color separately, i.e. "sub-pixel" (for example, in the figure, each pixel unit 6 is a pixel, which comprises three sub-pixels at the same time). The display device further comprises a plurality of light sensing units 1. The light sensing units 1 can generate different sensed signals based on the intensity of the light emitted thereon, and can specifically include photosensitive diodes, photistors, photosensitive resistors and the like. When a finger presses the display device, the valley 91 and the ridge 92 of the fingerprint can has the light emitted by the pixel unit 6 reflected to varying degrees, thereby the light received by the light sensing units 1 at positions corresponding to the valley 91 and the ridge 92 of the fingerprint has different intensities, and the sensed signals generated are also different. The analysis unit (for example, the fingerprint identification chip) is further used to analyze the sensed signal, so as to realize fingerprint identification.

Unlike the conventional display device, the display device of this embodiment further comprises a control unit 7 for enabling part of the pixel units 6 to emit light and keeping other pixel units 6 not to emit light when performing fingerprint identification.

That is to say, when performing fingerprint identification, not all of the pixel units 6 of the display device of this embodiment emit light together, but only a part of the pixel units 6 emit light, while other pixels units 6 do not emit light. Since only part of the pixel units 6 emit light in fingerprint identification, apparently, the light incident on each light sensing unit 1 can only come from the pixel units 6 that emit light currently. Hence, the light path thereof is relatively simple, which is easy to determine the source of the light. The sensed signal has a high signal to noise ratio and the fingerprint identification has a high accuracy.

The above plurality of light sensing units 6 can be uniformly distributed in the display panel of the display device, so as to ensure that the display device also has the touch function. Since the light sensing unit can distinguish the fingerprint, it certainly can also distinguish the position of the finger.

There may be various ways of enabling the pixel unit 6 to emit or not to emit light. For example, enabling the pixel unit 6 to emit light can be controlling it to display a content with certain brightness. Enabling the pixel unit 6 not to emit light can be enabling it to display a content of a pure black/a lowest gray scale, or signal supply to the pixel unit 6 can also be cut off, so as to enable it to be in a non-working state (corresponding to a display device in a normally black mode).

Certainly, the above emitting light or not emitting light are only directed at the fingerprint identification phase. However, in the display phase, the pixel units 6 shall all emit light normally according to the contents that should be displayed. Although it is also possible that part of the pixel units 6 do not emit light at this moment, fingerprint identification is not performed based on the sensed signal. The fingerprint identification phase can be set in various ways. For example, the fingerprint identification phase can take place alternately with the display phase on schedule, or it can also take place after running certain programs or performing certain operations.

Figure 2:
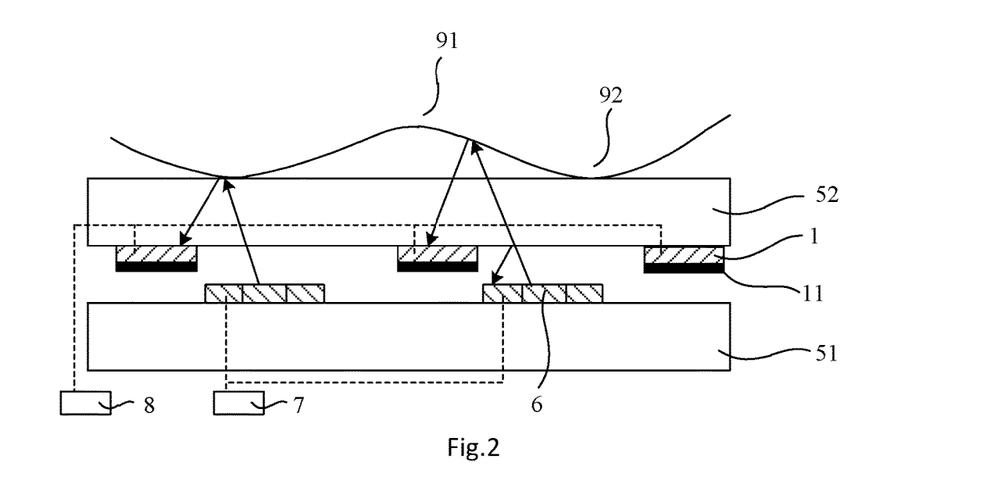
FIG. 2 is a schematic view of a sectional structure of a display device provided by an embodiment of the present disclosure.

Optionally, the display device comprises a first substrate 51 and a second substrate 52 which are assembled, wherein the second substrate 52 is located at the light exit side of the display device, the light sensing units 1 are arranged in the second substrate 52, and the side thereof facing towards the first substrate 51 is provided with a light shielding layer 11.

The display panel of the display device is generally formed by assembling two substrates (such as an array substrate and a counter substrate), wherein the second substrate 52 (such as the counter substrate) is located at the light exit side, while the light sensing units 1 are arranged on the first substrate 51 (such as the array substrate). Thus, the distance between the light sensing unit 1 and the finger is relatively large, the divergence of the reflected light is serious, and the light reflected by the structure in the second substrate 52 might be incident on the light sensing unit 1, such that the source of the light received by the light sensing unit 1 is not clear.

In an embodiment of the present disclosure, as shown in FIG. 2, the light sensing units 1 are arranged in the second substrate 52 (such as at a side close to the first substrate 51). Because the light sensing units 1 are arranged on the second substrate 52 at the light exit side, the side thereof close to the first substrate 51 will be irradiated directly by the light emitted by the pixel unit 6. In order to avoid such light from influencing the fingerprint detection, a light shielding layer 11 (such as a black matrix) should be arranged at a side of the light sensing unit 1 facing towards the first substrate 51.

In the display device of this embodiment, the light sensing units 1 are arranged in the second substrate 52 close to the light exit side, thereby reducing the distance between the light sensing unit 1 and the finger, reducing divergence of the light, and enabling the light reflected by the second substrate 52 not to be incident on the light sensing unit 1. Thus, the source of the light received by the light sensing unit 1 becomes more explicit, the noise in the generated sensed signal is smaller, and the fingerprint identification can be realized more accurately.

Optionally, the display device comprises a first substrate 51 and a second substrate 52 which are assembled, wherein the second substrate 52 is located at the light exit side of the display device, the light sensing units 1 are arranged in the first substrate 51, and the first substrate 51 is an array substrate.

Figure 8:
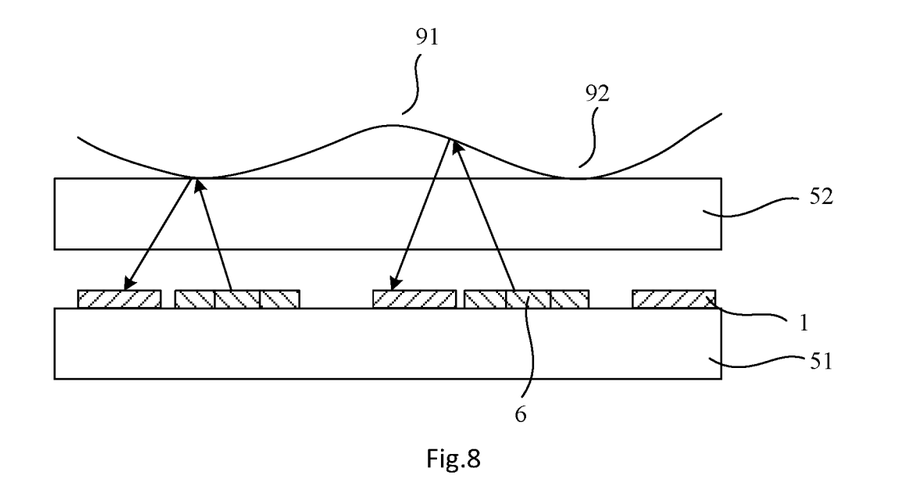
FIG. 8 is a schematic view of a sectional structure of another display device provided by an embodiment of the present disclosure.

That is to say, as shown in FIG. 8, if the array substrate is the first substrate 51 away from the light exit side, the light sensing units 1 can also be arranged in the array substrate (the first substrate 51), This is because many structures such as leads and electrodes should be prepared in the array substrate, it is relatively simple in technique to form the light sensing units 1 (and the corresponding leads thereof etc.) therein simultaneously.

Certainly, for a light emitting diode display device of bottom emission or the like, the array substrate thereof might be located at the light exit side (i.e., the second substrate 52) originally. In such a case, arranging the light sensing units 1 directly in the array substrate (the second substrate 52) can not only reduce the distance between the light sensing unit 1 and the finger, but also can facilitate preparation of the light sensing unit 1.

Optionally, each light sensing unit 1 corresponds to one pixel unit 6. The distance between the light sensing unit 1 and the pixel unit 6 to which it corresponds is smaller than the distance between the light sensing unit 1 and any one of the other pixel units 6.

Figure 3:
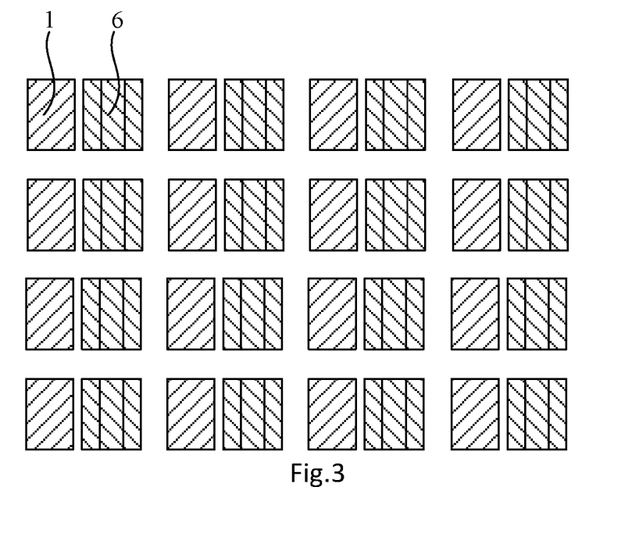
FIG. 3 is a schematic view of a top-view structure of a display device provided by an embodiment of the present disclosure.

That is to say, as shown in FIG. 2 and FIG. 3, in the display device of this embodiment, each light sensing unit 1 corresponds to one pixel unit 6, and the distance between the light sensing unit 1 and the pixel unit 6 to which it corresponds is the smallest. Thus, as shown in FIG. 2, the light incident on each light sensing unit 1 mainly comes from the pixel unit 6 to which it corresponds, or this can allow the light emitted by the pixel unit 6 to have "directivity" and be mainly directed to the corresponding light sensing unit 1. Hence, the source of the light incident on the light sensing unit 1 is more explicit and the fingerprint identification can be realized more accurately.

Optionally, each pixel unit 6 only corresponds to one light sensing unit 1 at most.

That is to say, the case of a plurality of light sensing units 1 corresponding to the same pixel unit 6 can be avoided. In this way, it can ensure that the light emitted by each pixel unit 6 mainly only influences one light sensing unit 1, while the light incident on each light sensing unit 1 also come from different pixel units 6, thereby further improving accuracy of the fingerprint identification.

Further optionally, each light sensing unit only corresponds to one pixel unit.

Certainly, according to the above requirement, between the pixel units 6 and the light sensing units 1, the form of "one-to-one correspondence" as shown in FIG. 2 and FIG. 3 can be adopted. However, "each pixel unit 6 only corresponds to one light sensing unit 1 at most" does not represent that the pixel units 6 and the light sensing units 1 must be in one-to-one correspondence, because the number of the pixel units 6 can be larger than that of the light sensing units 1, i.e., there may be some pixel units 6 that have no corresponding light sensing units 1.

Optionally, the display device is a light emitting diode display device.

Since, in the light emitting diode display device, it is an independent light emitting diode in each sub-pixel that emits light, the light emitting area, direction and the like of each pixel unit 6 can be controlled more easily, which is more benefit for carrying out the present disclosure.

The light emitting diode mentioned in the above embodiment can be an OLED (organic light emitting diode) or a QLED (quantum dot light emitting diode). The light emitting diode constitutes a pixel unit for displaying images. When performing fingerprint identification, the light emitting diode can provide irradiation light.

This embodiment further provides a fingerprint identification method of a display device, the display device (e.g., the display device as stated above) in which it is applicable comprises a plurality of pixel units 6 for display and a plurality of light sensing units 1 for generating a sensed signal based on intensity of received light.

Specifically, the fingerprint identification method of this embodiment comprises: enabling part of the pixel units 6 to emit light and keeping other pixel units 6 not to emit light, and performing fingerprint identification based on the sensed signal generated by the light sensing unit 1.

The fingerprint identification method of this embodiment collects the sensed signal in the event that only part of the pixel units 6 emit light, while the light incident on each light sensing unit 1 only comes from the pixel units 6 that emit light currently. Therefore, the light path thereof is relatively simple, which is easy to accurately determine the source of the light. The noise in the sensed signal is small, and the accuracy of the fingerprint identification is high.

Optionally, the step of performing fingerprint identification based on the sensed signal generated by the plurality of light sensing units comprises: according to a corresponding relationship between the light sensing unit and the pixel unit (for example, the corresponding relationship described in the above embodiments), during a light emitting period of the pixel unit, only turning on a corresponding light sensing unit, and performing fingerprint identification based on the sensed signal generated by the plurality of light sensing units.

By means of the above configuration, the light that enters a certain light sensing unit only comes from particular pixel units (for example the adjacent pixel units), so as to further reduce the noise in the sensed signal and improve the accuracy of the fingerprint identification.

Optionally, the fingerprint identification method of this embodiment comprises n phases, wherein n is an integer greater than or equal to 2. The above step of enabling part of the pixel units 6 to emit light and keeping other pixel units 6 not to emit light specifically comprises: enabling a group of pixel units 6 to emit light and keeping other pixel units 6 not to emit light in each phase, and the pixel units 6 that emit light in any two phases are not identical.

That is to say, the fingerprint identification method of this embodiment can comprise a plurality of steps (i.e., a plurality of phases) of "enabling part of the pixel units 6 to emit light", there is part of pixel units 6 that emit light in each phase, and the pixel units 6 that emit light in various phases are different. Finally, a fingerprint pattern is obtained from synthesis of the sensed signals in all phases.

According to this way, the light emitting manner of the display device in each phase is different, so the sensed signals generated by the light sensing units 1 in different cases can be detected, so as to determine the reflection condition of the fingerprint more accurately and realize a higher accuracy fingerprint identification.

Optionally, the pixel units 6 are divided into n groups. The above step of enabling part of the pixel units 6 to emit light and keeping other pixel units 6 not to emit light specifically comprises: in each phase enabling a group of pixel units 6 to emit light and keeping all other pixel units 6 not to emit light, and each group of pixel units 6 emit light once in n phases.

That is to say, all the pixel units 6 can be divided into a plurality of groups, and the pixel units 6 in each group constitute a particular "pattern". However, in the fingerprint identification process, the groups of pixel units emit light alternately, each group of pixel units 6 all and only emit light once. Thus, in the whole fingerprint identification process, each pixel unit 6 must have emitted light, so the fingerprint at a position corresponding to each pixel unit 6 can be detected, the sensed information collected by it is most comprehensive, and the most accurate fingerprint identification can be realized.

Optionally, for each pixel unit 6, at least one of the pixel units 6 adjacent to it is a pixel unit 6 not in a same group as this pixel unit.

Apparently, when the pixel units 6 are grouped, if a certain group of pixel units 6 covers a large continuous area, it is of little significance for improving the accuracy of the identification, because the light emitted by each pixel unit 6 can mainly influence its neighboring areas. Therefore, according to the above way, the light received by the light sensing unit 1 in the large continuous area will still come from all pixel units 6 around it, which cannot play the function of simplifying the light path. To this end, different groups of pixel units 6 should be arranged "alternately" or "crosswise" as far as possible. Specifically, at least a part of a plurality of pixel units 6 adjacent to any pixel unit 6 (such as the four pixel units located at two sides of the pixel unit 6 in the row direction and the column direction respectively) are not in the same group as this pixel unit 6.

Further optionally, n=2, the plurality of pixel units 6 are divided into a first group of pixel units and a second group of pixel units.

That is to say, from the perspective of being simple and convenient, all the pixel units 6 can be divided into two groups, and the fingerprint identification process can also be divided into two phases accordingly. The two groups of pixel units 6 emit light in the two phases respectively.

Figure 4:
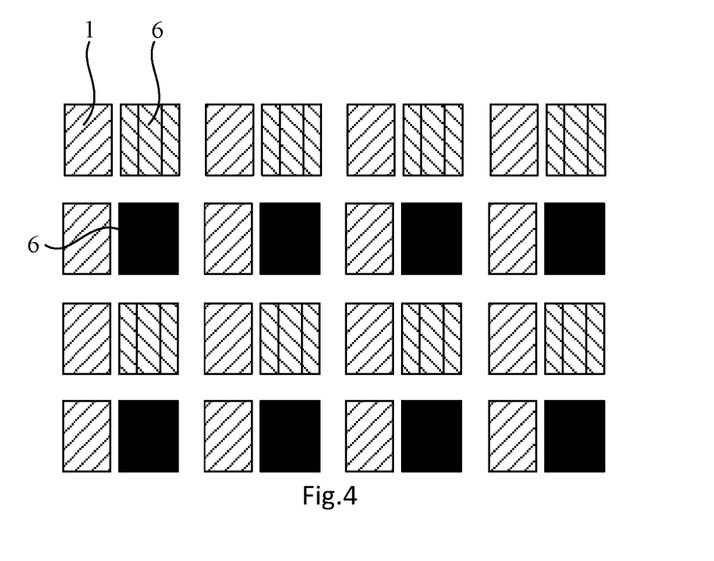
FIG. 4 is a schematic top view of a display device provided by an embodiment of the present disclosure in a first phase of fingerprint identification.
Figure 5:
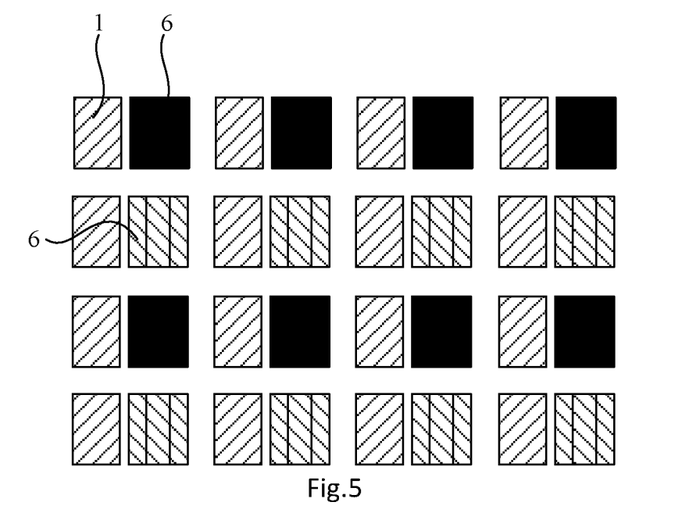
FIG. 5 is a schematic top view of a display device provided by an embodiment of the present disclosure in a second phase of fingerprint identification.

Further, the pixel units 6 are arranged in an array. In an embodiment, in any two adjacent rows of pixel units 6, one row of pixel units 6 belong to the first group of pixel unit, and the other row of pixel units 6 belong to the second group of pixel units (as shown in FIGS. 4 and 5).

That is to say, the above two groups of pixel units 6 can be distributed in rows alternately, wherein one group is the odd rows of pixel units 6, and the other group is the even rows of pixel units 6. In the fingerprint identification process, as shown in FIGS. 4 and 5, in the first phase, the odd rows of pixel units 6 emit light firstly, and in the second phase, the even rows of pixel units 6 emit light. Certainly, the above two phases are relative, so it is also feasible if the even rows of pixel units 6 emit light firstly and then the odd rows of pixel units 6 emit light.

Or, in another embodiment, in any two adjacent columns of pixel units 6, one column of pixel units 6 belong to the first group of pixel units, and the other column of pixel units 6 belong to the second group of pixel units.

That is to say, the above two groups of pixel units 6 can also be distributed in columns alternately, wherein one group is the odd columns of pixel units 6 and the other group is the even column of pixel units 6. Since the light emitting manner thereof in the fingerprint identification process is similar as in the row interlacing arrangement, it will not be described in detail here.

Figure 6:
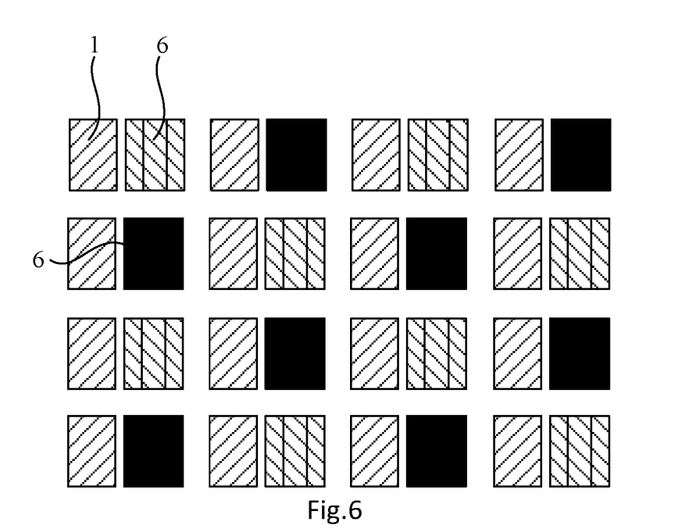
FIG. 6 is a schematic top view of another display device provided by an embodiment of the present disclosure in a first phase of fingerprint identification.
Figure 7:
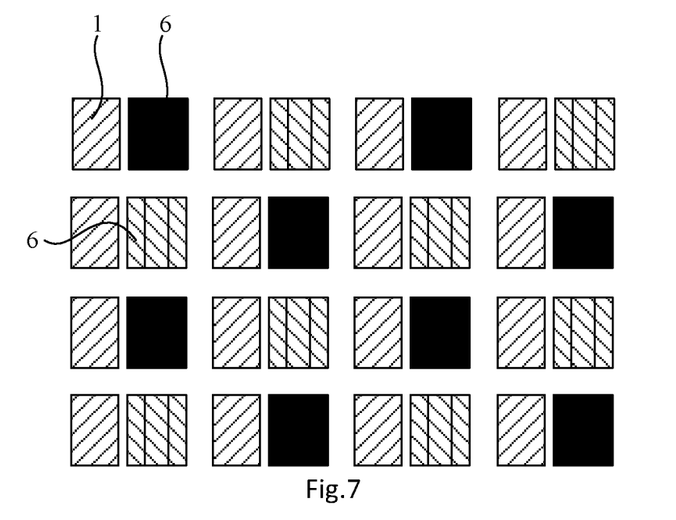
FIG. 7 is a schematic top view of another display device provided by an embodiment of the present disclosure in a second phase of fingerprint identification.

Or, in another embodiment, all of pixel units directly adjacent to each of the first group of pixel units 6 in the row or column direction belong to the second group of pixel units; all of pixel units directly adjacent to each of the second group of pixel units 6 in the row or column direction belong to the first group of pixel units. As shown in FIGS. 6 and 7, in each row of pixel units 6, the first group of pixel units 6 and the second group of pixel units 6 are arranged alternately. In each column of pixel units 6, the first group of pixel units 6 and the second group of pixel units 6 are arranged alternately.

That is to say, the above two groups of pixel units 6 can also be distributed alternately in the form of a "chessboard". One group of pixel units 6 are located at positions corresponding to the black grids of the chessboard of the chess, and the other group of pixel units 6 are located at positions corresponding to the white grids of the chessboard of the chess. In the fingerprint identification process, as shown in FIGS. 6 and 7, in the first phase, one group of pixel units 6 emit light firstly, and in the second phase, it is the other group of pixel units 6 that emits light.

Certainly, the specific grouping manners (or the patterns) of the above pixel units 6 are various, which will not be described in detail here.

Optionally, each pixel unit only corresponds to one light sensing unit 1 at most.

That is to say, the case of a plurality of light sensing units 1 corresponding to the same pixel unit 6 can be avoided. In this way, it can ensure that the light emitted by each pixel unit 6 mainly only influences one light sensing unit 1, while the light incident on each light sensing unit 1 also come from different pixel units 6, thereby further improving accuracy of the fingerprint identification. Further optionally, each light sensing unit only corresponds to one pixel unit.

It can be understood that the above implementations are only exemplary embodiments used for explaining the principle of the present disclosure. However, the present disclosure is not limited to these. For the ordinary skilled person in the art, in the case of not departing from the spirit and the essence of the present disclosure, various modifications and improvements can be made. These modifications and improvements should also be regarded as the protection scopes of the present disclosure.

The invention claimed is:

1. A fingerprint identification method of a display device, the display device comprising a plurality of pixel units for display, a plurality of light sensing units for generating sensed signals based on intensity of received light, and a first substrate and a second substrate which are assembled, wherein the second substrate is located at a light exit side of the display device, the light sensing units are arranged in the second substrate and a side thereof facing towards the first substrate is provided with a light shielding layer; wherein the fingerprint identification method comprises:
enabling part of the pixel units to emit light and keeping other pixel units not to emit light, and performing fingerprint identification based on the sensed signal generated by the plurality of light sensing units.

2. The fingerprint identification method of a display device according to claim 1, wherein performing fingerprint identification based on the sensed signal generated by the plurality of light sensing units comprises:
according to a corresponding relationship between the light sensing unit and the pixel unit, during a light emitting period of the pixel unit, only turning on a corresponding light sensing unit, and performing fingerprint identification based on the sensed signal generated by the plurality of light sensing units.

3. The fingerprint identification method of a display device according to claim 1, wherein the fingerprint identification method comprises n phases, wherein n is an integer greater than or equal to 2; and said enabling part of the pixel units to emit light and keeping other pixel units not to emit light comprises:
in each phase, enabling a group of pixel units to emit light and keeping other pixel units not to emit light, and pixel units that emit light in any two phases are not identical.

4. The fingerprint identification method of a display device according to claim 3, wherein the pixel units are divided into n groups, and said enabling part of the pixel units to emit light and keeping other pixel units not to emit light comprises:
in each phase, enabling a group of pixel units to emit light and keeping all other pixel units not to emit light, and enabling each group of pixel units to emit light once in n phases.

5. The fingerprint identification method of a display device according to claim 4, wherein for each pixel unit, at least one of the pixel units adjacent to it is a pixel unit not in a same group as this pixel unit.

6. The fingerprint identification method of a display device according to claim 5, wherein n=2, the plurality of pixel units are divided into a first group of pixel units and a second group of pixel units, and the plurality of pixel units are arranged in an array, wherein,
in any two adjacent rows of pixel units, one row of pixel units belong to the first group of pixel units, and the other row of pixel units belong to the second group of pixel units; or,
in any two adjacent columns of pixel units, one column of pixel units belong to the first group of pixel units, and the other column of pixel units belong to the second group of pixel units; or,
all of pixel units directly adjacent to each of the first group of pixel units in the row or column direction belong to the second group of pixel units, and all of pixel units directly adjacent to each of the second group of pixel units in the row or column direction belong to the first group of pixel units.

7. The fingerprint identification method of a display device according to claim 1, wherein each pixel unit only corresponds to one light sensing unit at most.

8. The fingerprint identification method of a display device according to claim 7, wherein each light sensing unit only corresponds to one pixel unit.

9. A display device, comprising:
a plurality of pixel units for display;
a plurality of light sensing units for generating a sensed signal based on intensity of received light;
wherein the display device further comprises:
a control unit for enabling part of the pixel units to emit light and keeping other pixel units not to emit light when performing fingerprint identification;
an analysis unit for performing fingerprint identification based on the sensed signal generated by the plurality of light sensing units; and
a first substrate and a second substrate which are assembled, wherein the second substrate is located at a light exit side of the display device, the light sensing units are arranged in the second substrate and a side thereof facing towards the first substrate is provided with a light shielding layer.

10. The display device according to claim 9, wherein each light sensing unit corresponds to one pixel unit; a distance between the light sensing unit and the pixel unit to which it corresponds is smaller than a distance between the light sensing unit and any one of other pixel units.

11. The display device according to claim 9, wherein each pixel unit only corresponds to one light sensing unit at most.

12. The display device according to claim 11, wherein each light sensing unit only corresponds to one pixel unit.

13. The display device according to claim 9, wherein the display device is a light emitting diode display device.

14. The fingerprint identification method of a display device according to claim 2, wherein the fingerprint identification method comprises n phases, wherein n is an integer greater than or equal to 2; and said enabling part of the pixel units to emit light and keeping other pixel units not to emit light comprises:
in each phase, enabling a group of pixel units to emit light and keeping other pixel units not to emit light, and pixel units that emit light in any two phases are not identical.

15. The fingerprint identification method of a display device according to claim 2, wherein each pixel unit only corresponds to one light sensing unit at most.

16. The fingerprint identification method of a display device according to claim 4, wherein each pixel unit only corresponds to one light sensing unit at most.

\* \* \* \* \*